United States Patent
Musa

(10) Patent No.: US 9,590,609 B1
(45) Date of Patent: Mar. 7, 2017

(54) GATE DRIVER WITH SHORT CIRCUIT PROTECTION

(71) Applicant: DELPHI TECHNOLOGIES, INC., Troy, MI (US)

(72) Inventor: Osman Musa, Kokomo, IN (US)

(73) Assignee: Delphi Technologies Inc., Troy, MI (US)

( * ) Notice: Subject to any disclaimer, the term of this patent is extended or adjusted under 35 U.S.C. 154(b) by 0 days.

(21) Appl. No.: 14/938,115

(22) Filed: Nov. 11, 2015

(51) Int. Cl.
*H03K 3/00* (2006.01)
*H03K 17/081* (2006.01)
*H03K 17/687* (2006.01)

(52) U.S. Cl.
CPC ..... *H03K 17/08104* (2013.01); *H03K 17/687* (2013.01)

(58) Field of Classification Search
CPC .............. H03K 17/08104; H03K 17/687
USPC ................................................. 327/108
See application file for complete search history.

(56) References Cited

U.S. PATENT DOCUMENTS

| | | | | |
|---|---|---|---|---|
| 6,466,080 B2* | 10/2002 | Kawai | ............... | G05F 3/262 327/538 |
| 7,071,740 B2* | 7/2006 | Adams | ............... | H03K 5/1252 327/110 |
| 7,151,401 B2* | 12/2006 | Inoue | ............... | H03K 17/0406 327/108 |
| 7,233,191 B2* | 6/2007 | Wang | ............... | H03K 17/063 327/430 |
| 7,362,147 B2* | 4/2008 | Rebholz-Goldmann | | H03K 17/164 327/108 |
| 8,497,714 B2* | 7/2013 | Garbossa | ............... | H02M 3/155 327/108 |
| 8,957,724 B2* | 2/2015 | Pavlin | ............... | G05F 1/46 327/427 |
| 9,024,558 B2* | 5/2015 | Sugie | ............... | H03K 3/012 318/400.26 |
| 9,397,658 B2* | 7/2016 | Sicard | ............... | H03K 17/687 |
| 2009/0002054 A1 | 1/2009 | Tsunoda et al. | | |
| 2012/0126859 A1 | 5/2012 | Kawamoto et al. | | |
| 2013/0214823 A1 | 8/2013 | Kawamoto et al. | | |
| 2013/0285732 A1 | 10/2013 | Mori | | |

* cited by examiner

*Primary Examiner* — Kenneth B Wells
(74) *Attorney, Agent, or Firm* — Lawrence D. Hazelton

(57) ABSTRACT

A gate-driver device for operating a field-effect-transistor (FET) includes a pull-down-block and a pull-up-block resistant to or protected from short circuits of the gate drive signal output by the device. The pull-down-block is operable to drive a gate of a FET to a low-voltage. The pull-up-block includes a resistive-pull-up operable to an ON-state and an OFF-state to switchably couple the gate to the high-voltage via an upper-resistive-element, and a current-pull-up arranged in parallel with the resistive-pull-up. The current-pull-up is operable to an ON-state and an OFF-state to control a current-source applied to the gate. When the pull-up-block drives the gate to the high-voltage, the resistive-pull-up and the current-pull-up operates from the OFF-state to the ON-state. A turn-on-interval after the resistive-pull-up operates from the OFF-state to the ON-state the resistive-pull-up operates to the OFF-state while the current-pull-up is maintained in the ON-state. Optionally, the pull-down-block may be similarly configured.

7 Claims, 3 Drawing Sheets

GATE DRIVER WITH SHORT CIRCUIT PROTECTION

TECHNICAL FIELD OF INVENTION

This disclosure generally relates to a gate-driver device for operating or driving a field-effect-transistor (FET), and more particularly relates to combining a resistive-device in parallel with a current-limited device to drive a gate of the FET and prevent undesirable operation if the gate-signal is shorted to some voltage potential.

BACKGROUND OF INVENTION

In order to properly operate a field-effect-transistor (FET) to control, for example, a fuel injector or ignition coil of an internal combustion engine, sophisticated gate-drivers with various schemes for protection against and detection of faults have been proposed. Some known examples of gate drivers that independently operate multiple instances of FETs simply connect the gate of each FET to a voltage from a gate-driver power supply. However, if one or more of the gate-signals output by the gate-driver experiences a strong short to ground potential or some other power supply voltage, one or more of the other FETs can be disabled, for example be stuck in an ON-state or an OFF-state depending on the nature of the short and the configuration of the gate-driver. What is needed is a gate-driver that protects the gate-driver power supply if one or more of the gate-signals from the gate-driver are shorted to ground or other power supply voltage.

SUMMARY OF THE INVENTION

In accordance with one embodiment, a gate-driver device for operating a field-effect-transistor (FET) is provided. The device includes a pull-down-block and a pull-up-block. The pull-down-block is operable to drive a gate of a FET to a low-voltage. The pull-up-block is operable to drive the gate of the FET to a high-voltage. The pull-up-block includes a resistive-pull-up operable to an ON-state and an OFF-state to switchably couple the gate to the high-voltage via an upper-resistive-element, and a current-pull-up arranged in parallel with the resistive-pull-up. The current-pull-up is operable to an ON-state and an OFF-state to control a current-source applied to the gate.

In accordance with one embodiment, a gate-driver device for operating a field-effect-transistor (FET) is provided. The device includes a pull-up-block and a pull-down-block. The pull-up-block is operable to drive a gate of a FET to a high-voltage. The pull-down-block is operable to drive the gate of the FET to a low-voltage. The pull-down-block includes a resistive-pull-down operable to an ON-state and an OFF-state to switchably couple the gate to the low-voltage via a lower-resistive-element, and a current-pull-down arranged in parallel with the resistive-pull-down. The current-pull-down is operable to an ON-state and an OFF-state to control a current-sink applied to the gate.

Further features and advantages will appear more clearly on a reading of the following detailed description of the preferred embodiment, which is given by way of non-limiting examples only, and with reference to the accompanying drawings.

BRIEF DESCRIPTION OF DRAWINGS

The present invention will now be described, by way of example with reference to the accompanying drawings, in which.

DETAILED DESCRIPTION

Figure 1:
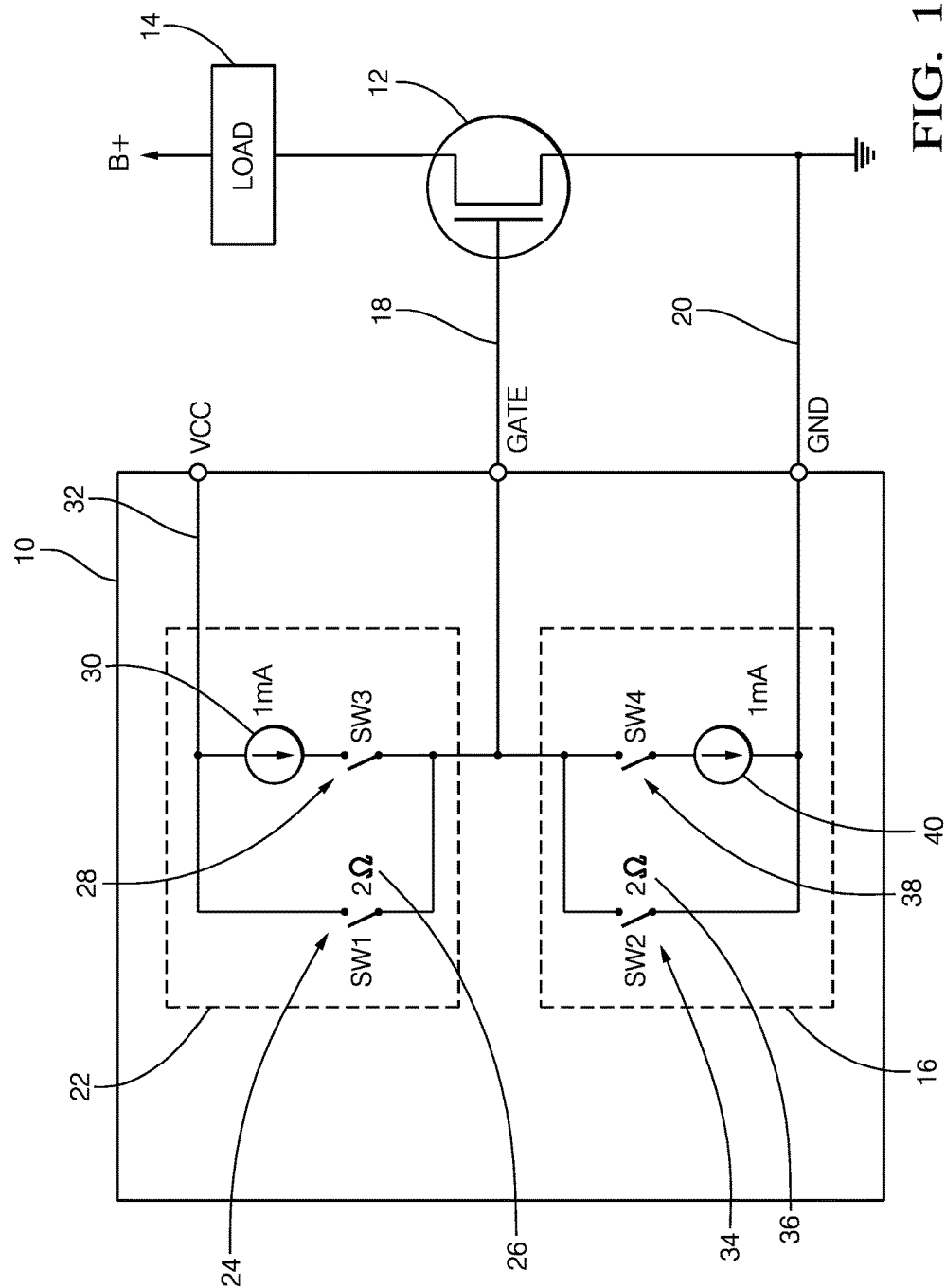
FIG. 1 is a schematic of a gate-driver in accordance with one embodiment.

FIG. 1 illustrates a non-limiting example of a gate-driver device 10, hereafter referred to as the device 10. The device 10 is advantageously well-suited for operating a field-effect-transistor 12, hereafter referred to as the FET 12. The FET 12 may be used to control the application of electrical power (B+, GND) to an electrical load 14, such as a fuel injector, solenoid, or other electromechanical device. While the non-limiting example shown in FIG. 1 shows only a single instance of the FET 12, it is contemplated that the device 10 may include a plurality of the circuits shown in FIG. 1 so that a plurality of FETs can be individually and independently operated. The benefit provided by the short-circuit protection described herein is particularly advantageous when the device 10 is configured to independently operate multiple instances of the FET 12. As will be recognized by those in the art, the device 10 is preferably in the form of an integrated-circuit; however this is not a requirement.

The device 10 may include inputs (not shown in FIG. 1, see FIG. 3) configured to receive control signals from, for example, a general purpose microprocessor, or other purpose built logic (not shown). As will also be recognized by those in the art, the device 10 may include a charge pump to provide the necessary voltage to facilitate the operation of various switching devices such a metal-oxide-semiconductor FETs (MOSFETs) within the device 10, and may be connected to one or more other electrical components external to the device 10, a capacitor or resistor for example. While the combination of the device 10 and FET 12 is shown configured to operate as a so-called low-side-driver, it is contemplated that the teachings presented herein are also applicable to high-side-driver configurations.

In general, the device 10 includes a pull-down-block 16 operable to drive a gate 18 of the FET 12 to a low-voltage 20, ground (GND=0 Volts) for example, and a pull-up-block 22 operable to drive the gate 18 of the FET 12 to a high-voltage 32, a signal-supply voltage (VCC=5 Volts) for example. As will be explained in more detail below, the device 10 described herein is an improvement over the prior art for two reasons. First, the device 10 prevents excessive current into or out of the device 10 if the output of the device 10 which is connected to the gate 18 is accidently or unexpectedly shorted to some voltage potential such as GND, B+, or any other low-source-resistance voltage. By preventing excessive current draw when one or more outputs (only one is shown) of the device 10 is, for example, shorted to ground (GND), then other FETs (not shown) that are being controlled or operated by the device 10 independent of the FET 12 will not be affected because VCC is not drawn down by the short. Furthermore, while the pull-up-block 22 and the pull-down-block 16 are illustrated with similar configurations, it is contemplated that in some circumstances only one of the pull-up-block 22 and the pull-down-block 16 may need to have the current limiting feature that will be described in more detail. Second, the device 10 greatly enhances the ability to detect fault conditions at the gate 18 because the output resistance of the device 10 for the majority of the switching period is relatively high in comparison to the resistance of a typical short circuit, as will be described later.

The pull-up-block 22 may include a resistive-pull-up 24 (SW1) operable to an ON-state and an OFF-state to switchably couple the gate 18 to the high-voltage 32 via an upper-resistive-element 26 that is part of the resistive-pull-up 24. The resistive-pull-up 24 may be a MOSFET (FIG. 3) with an on-resistance, Rds(on), equal to a desired value of the upper-resistive element, two Ohms (2Ω) for example. Alternatively, the upper-resistive-element 26 may be a separate resistive component (not shown) connected to a switch SW1, where the on-resistance of the switch SW1 is substantially less than the resistive value of the separate resistive component. The current limiting feature mentioned above is provided by a current-pull-up 28 arranged in parallel with the resistive-pull-up 24. The current-pull-up 28 is similarly operable to an ON-state and an OFF-state to control a current-source 30 applied to the gate 18. In the non-limiting example illustrated, the current-source 30 is selectively connected to the gate 18 by a switch SW3. Alternatively, the current-source 30 may be provided by a variable current source that is selectively operable from zero current, i.e. an open circuit, to a desired current value, one milli-Ampere (1 mA) for example.

Figure 2:
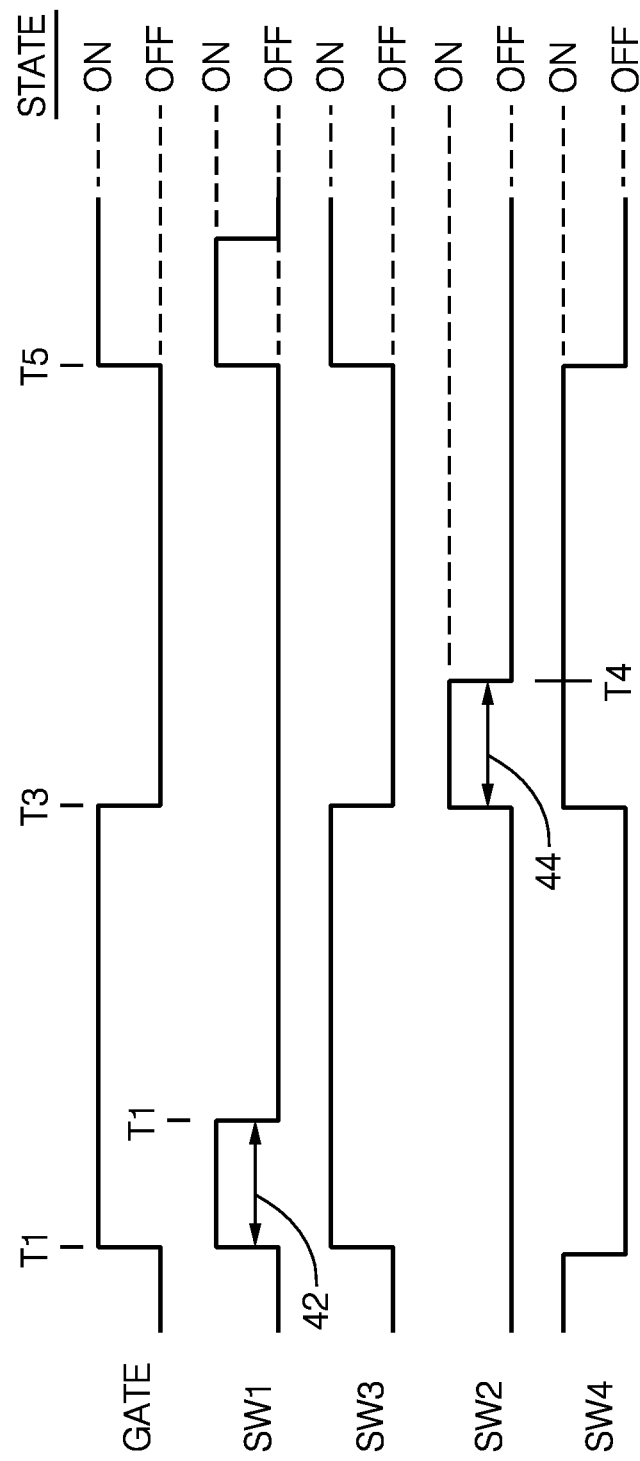
FIG. 2 is a diagram of signals present in the gate-driver of FIG. 1 in accordance with one embodiment.

FIG. 2 illustrates a non-limiting example of signals present in the device 10 that will now be used to further explain how the device 10 prevents undesirable operation of the device 10 if the gate 18 is short to some voltage, particularly when multiple instances of FETs are being operated by multiple instance of the gate-drive circuitry shown in FIG. 1. At time T1 both the switch SW1 and the switch SW3 operate or transition from the OFF-state (i.e. open-state) to the ON-state (i.e. closed-state). Initially, the relatively low resistance of the resistive-pull-up 24 quickly charges the gate 18 of the FET 12 to relatively quickly operate the FET 12 from the OFF-state to the ON-state. While FIG. 2 illustrates that the pull-up-block 22 simultaneously operates the resistive-pull-up 24 from the OFF-state to the ON-state and the current-pull-up 28 from the OFF-state to the ON-state, i.e. at the same time or instant (T1), it is contemplated that the operation of SW3 could be delayed. That is, it is not a requirement that both the resistive-pull-up 24 and the current-pull-up 28 operate from the OFF-state to the ON-state at the same instant in time.

Once enough time after time T1 has passed so the FET 12 is fully on, i.e. fully enhanced, the connection of the gate 18 to the high-voltage 32 via the resistive-pull-up 24 can be turned off, but the current-pull-up 28 remains on to keep the FET 12 fully enhanced. By turning the current-pull-up 28 off, if the gate 18 is shorted to ground, that short will not pull the high-voltage down towards ground. Furthermore, if the gate 18 is shorted to ground, the pull-up-block 22 will not be damaged by excessive current flowing through the resistive-pull-up 24. That is, when the pull-up-block 22 drives the gate 18 to the high-voltage 32, the resistive-pull-up 24 operates from the OFF-state to the ON-state, the current-pull-up 28 operates from the OFF-state to the ON-state, and a turn-on-interval 42 (T2−T1) after the resistive-pull-up 24 operates from the OFF-state to the ON-state the resistive-pull-up 24 operates to the OFF-state while the current-pull-up 28 is maintained in the ON-state.

Referring again to FIG. 1, like the pull-up-block 22, the pull-down-block 16 may include a resistive-pull-down 34 operable to an ON-state and an OFF-state to switchably couple the gate 18 to the low-voltage 20 via a lower-resistive-element 36, and a current-pull-down 38 arranged in parallel with the resistive-pull-down 34. The current-pull-down 38 is similarly operable to an ON-state and an OFF-state to control a current-sink 40 applied to the gate 18. The resistive-pull-down 34 and the current-pull-down 38 may include MOSFETs for SW2 and SW4 and be otherwise configured similar to the corresponding features in the pull-up-block 22. Also like the pull-up-block 22, when the pull-down-block 16 drives the gate 18 to the low-voltage 20, the resistive-pull-down 34 operates from the OFF-state to the ON-state, the current-pull-down 38 operates from the OFF-state to the ON-state, and a turn-off-interval 44 (T4−T3) after the resistive-pull-down 34 operates from the OFF-state to the ON-state the resistive-pull-down 34 operates to the OFF-state while the current-pull-down 38 is maintained in the ON-state.

In one embodiment, the pull-down-block 16 simultaneously operates the resistive-pull-down 34 from the OFF-state to the ON-state and the current-pull-down 38 from the OFF-state to the ON-state, i.e. at the same time or instant in time. Alternatively, as suggested above with the pull-up-block 22, the pull-down-block 16 may be configured to delay the operating of switch SW4 to the closed state until briefly after switch SW2 is closed.

Figure 3:
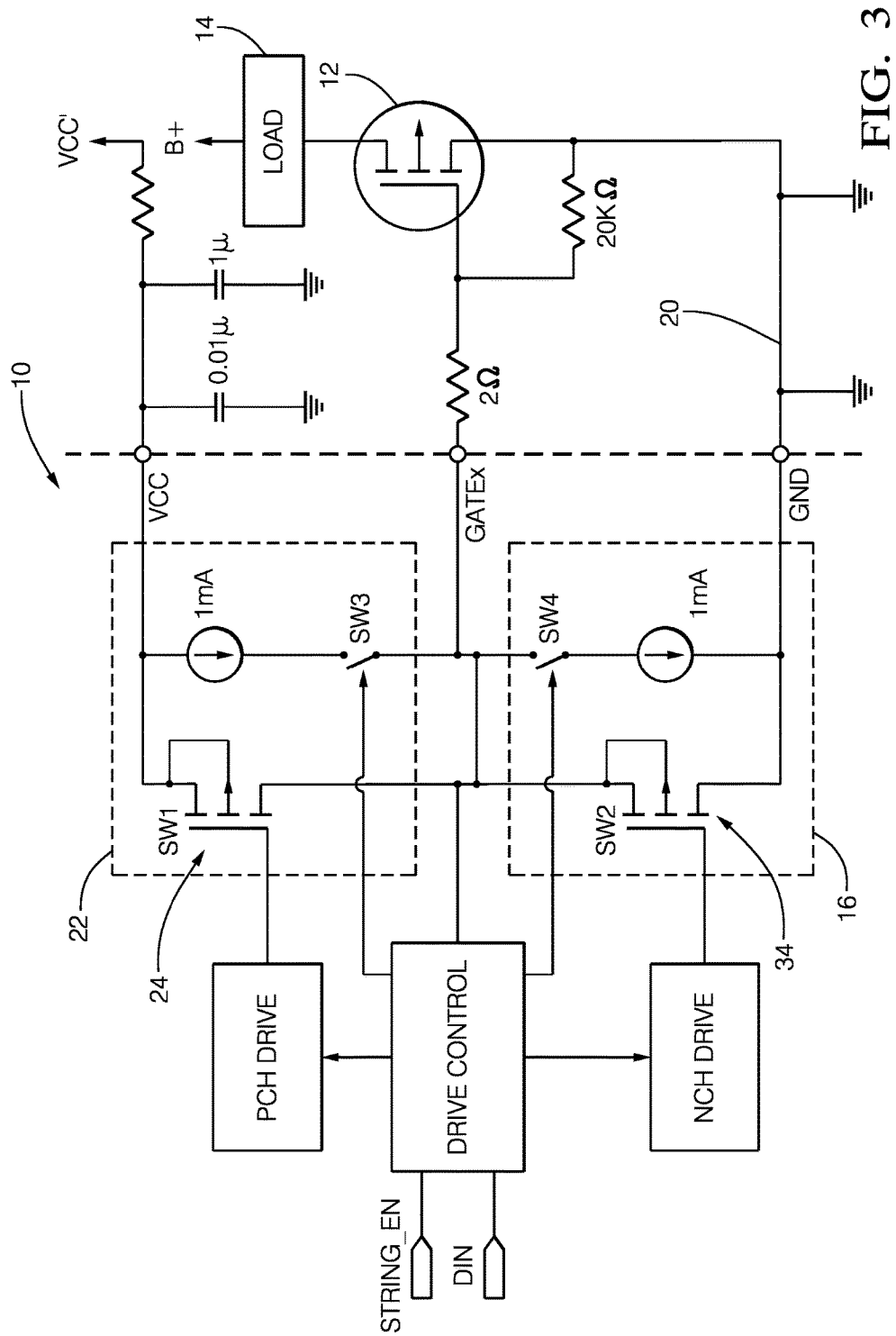
FIG. 3 is an alternative configuration of a gate driver in accordance with one embodiment.

FIG. 3 illustrates further details of a non-limiting example of the device 10. In this example the resistive-pull-up 24 and the resistive-pull-down 34 are both illustrated as MOSFETs, where the on-resistance, Rds(on), is equal to a desired value, two Ohms (2Ω) for example. The resistive-pull-up 24 is a P-channel MOSFET so is driven by a P-channel driver (PCH DRIVE). The resistive-pull-down 34 is an N-channel MOSFET so is driven by an N-channel driver (NCH DRIVE).

Accordingly, a gate-driver device (the device 10) for operating a field-effect-transistor (FET) is provided. By operating the gate drive circuit in a high current mode via the resistive-pull-up 24 or the resistive-pull-down 34 for only a predetermined time interval (T2−T1 or T4−T3), short circuit type damage and/or undesirable operation (i.e. latching) of multiple instance of the FET 12 can be avoided, and the ability to detect such a fault is improved. For example, if the on-resistance of the device 10 remained at two Ohms for the entire turn-on period (T3−T1) or (T5−T3), then if for example a forty-eight Ohms resistive short to ground occurs at the gate 18 of FET 12 while the device 10 is trying to pull the gate of FET 12 to VCC (e.g. +5 Volts), then the device 10 will still be able to pull the gate 18 voltage to within two hundred millivolts of the +5V supply while drawing a 100 milli-amperes of current from the supply VCC. As such, an accurate fault-detection circuit is required in order for the system to determine that a fault has occurred. In addition, the power supply and the resistive pull-up 24 and the resistive pull-down 34 of the gate driver (the device 10) will need to be rated to supply and withstand such power consumption without collapsing the power supply or sustaining permanent damage to the device 10. Whereas, limiting the turn-on-interval 42 (T2−T1) and the turn-off-interval 44 (T4−T3) to the predetermined amount needed to fully charge the gate of FET1 reduces the amount of power dissipation in the event of a short while increasing the likelihood of detecting the fault when it occurs using relatively simple fault detection circuits.

While this invention has been described in terms of the preferred embodiments thereof, it is not intended to be so limited, but rather only to the extent set forth in the claims that follow.

I claim:

1. A gate-driver device for operating a field-effect-transistor (FET), said device comprising:
   a pull-down-block operable to drive the gate of a FET to a low-voltage that is effective to operate the FET to a first-state; and
   a pull-up-block operable to drive the gate of the FET to a high-voltage that is effective to operate the FET to a second-state different from the first-state, wherein the pull-up-block includes a resistive-pull-up operable to an ON-state and an OFF-state to switchably couple the gate to the high-voltage via an upper-resistive-element, and a current-pull-up arranged in parallel with the resistive-pull-up, wherein the current-pull-up is operable to an ON-state and an OFF-state to control a current-source applied to the gate, wherein when the pull-up-block drives the gate to the high-voltage, the resistive-pull-up operates from the OFF-state to the ON-state, the current-pull-up operates from the OFF-state to the ON-state, and then, a turn-on-interval after the resistive-pull-up was operated from the OFF-state to the ON-state, the resistive-pull-up operates to the OFF-state while the current-pull-up is maintained in the ON-state.

2. The device in accordance with claim 1, wherein the pull-up-block simultaneously operates the resistive-pull-up from the OFF-state to the ON-state and the current-pull-up from the OFF-state to the ON-state.

3. The device in accordance with claim 1, wherein the pull-down-block includes a resistive-pull-down operable to an ON-state and an OFF-state to switchably couple the gate to the low-voltage via a lower-resistive-element, and a current-pull-down arranged in parallel with the resistive-pull-down, wherein the current-pull-down is operable to an ON-state and an OFF-state to control a current-sink applied to the gate.

4. The device in accordance with claim 3, wherein, when the pull-down-block drives the gate to the low-voltage, the resistive-pull-down operates from the OFF-state to the ON-state, the current-pull-down operates from the OFF-state to the ON-state, and then, a turn-off-interval after the resistive-pull-down was operated from the OFF-state to the ON-state, the resistive-pull-down operates to the OFF-state while the current-pull-down is maintained in the ON-state.

5. The device in accordance with claim 4, wherein the pull-down-block simultaneously operates the resistive-pull-down from the OFF-state to the ON-state and the current-pull-down from the OFF-state to the ON-state.

6. The device in accordance with claim 3, wherein, when the pull-up-block drives the gate to the high-voltage, the resistive-pull-up operates from the OFF-state to the ON-state at the same time that the current-pull-up operates from the OFF-state to the ON-state, and then, a turn-on-interval after the resistive-pull-up operates from the OFF-state to the ON-state, the resistive-pull-up operates to the OFF-state while the current-pull-up is maintained in the ON-state, and wherein, when the pull-down-block drives the gate to the low-voltage, the resistive-pull-down operates from the OFF-state to the ON-state at the same time that the current-pull-down operates from the OFF-state to the ON-state, and then, a turn-off-interval after the resistive-pull-down was operated from the OFF-state to the ON-state, the resistive-pull-down operates to the OFF-state while the current-pull-down is maintained in the ON-state.

7. A gate-driver device for operating a field-effect-transistor (FET), said device comprising:
   a pull-up-block operable to drive the gate of a FET to a high-voltage that is effective to operate the FET to a first-state; and
   a pull-down-block operable to drive the gate of the FET to a low-voltage that is effective to operate the FET to a second-state different from the first-state, wherein the pull-down-block includes a resistive-pull-down operable to an ON-state and an OFF-state to switchably couple the gate to the low-voltage via a lower-resistive-element, and a current-pull-down arranged in parallel with the resistive-pull-down, wherein the current-pull-down is operable to an ON-state and an OFF-state to control a current-sink applied to the gate, wherein when the pull-down-block drives the gate to the low-voltage, the resistive-pull-down operates from the OFF-state to the ON-state, the current-pull-down operates from the OFF-state to the ON-state, and then, a turn-on-interval after the resistive-pull-down was operated from the OFF-state to the ON-state, the resistive-pull-down operates to the OFF-state while the current-pull-down is maintained in the ON-state.

\* \* \* \* \*